United States Patent [19]
Gafken

[11] Patent Number: 6,026,016
[45] Date of Patent: Feb. 15, 2000

[54] METHODS AND APPARATUS FOR HARDWARE BLOCK LOCKING IN A NONVOLATILE MEMORY

[75] Inventor: Andrew H. Gafken, Folsom, Calif.

[73] Assignee: Intel Corporation, Santa Clara, Calif.

[21] Appl. No.: 09/078,094

[22] Filed: May 11, 1998

[51] Int. Cl.[7] .................................................. G11C 16/04
[52] U.S. Cl. .............................. 365/185.04; 365/185.29; 365/185.33
[58] Field of Search ................................ 365/185.04, 195, 365/189.01, 185.33, 185.29, 52, 189.04, 241; 395/430, 425; 380/23, 185.33, 185.04, 52

[56] References Cited

U.S. PATENT DOCUMENTS

| | | | |
|---|---|---|---|
| 5,065,364 | 11/1991 | Atwood et al. ........................ | 365/185 |
| 5,126,808 | 6/1992 | Montalvo et al. ..................... | 357/23.5 |
| 5,197,034 | 3/1993 | Fandrich et al. ...................... | 365/227 |
| 5,210,845 | 5/1993 | Crawford et al. ..................... | 395/425 |
| 5,297,148 | 3/1994 | Harari et al. ......................... | 371/10.2 |
| 5,369,754 | 11/1994 | Fandrich et al. ...................... | 395/425 |
| 5,438,546 | 8/1995 | Ishac et al. ............................ | 365/200 |
| 5,442,704 | 8/1995 | Holtey ................................... | 380/23 |
| 5,509,134 | 4/1996 | Fandrich et al. ...................... | 395/430 |
| 5,513,136 | 4/1996 | Fandrich et al. ................... | 365/185.04 |
| 5,592,641 | 1/1997 | Fandrich et al. ...................... | 395/430 |

*Primary Examiner*—Trong Phan
*Assistant Examiner*—Thong Le
*Attorney, Agent, or Firm*—Cindy T. Faatz

[57] ABSTRACT

A memory device. The memory device includes a nonvolatile memory array including a first block of memory cells. A first volatile protection bit coupled to the first block is programmable to prevent a memory access operation directed to the first block from being performed.

38 Claims, 9 Drawing Sheets

6,026,016

METHODS AND APPARATUS FOR HARDWARE BLOCK LOCKING IN A NONVOLATILE MEMORY

FIELD OF THE INVENTION

The present invention relates generally to memory devices and more particularly to a method and apparatus for locking and unlocking blocks of memory cells in a nonvolatile memory device to disable and enable write and erase, and in some cases, read operations to the blocks of memory.

BACKGROUND OF THE INVENTION

Nonvolatile semiconductor memories use a variety of semiconductor memory cell designs. One type of memory cell is a "flash" memory cell that is electrically erasable and electrically programmable. Once programmed, flash memory cells retain their data until it is erased.

Data integrity is very important for many flash memory applications and other nonvolatile memory applications. For example, a flash memory may be used to store the start-up and/or basic input/output system (BIOS) routines that are executed when a computer system is reset or turned on.

If the BIOS or other start-up code is altered or corrupted in some manner, the computer system may not operate properly. It is, therefore, desirable to be able protect the BIOS and other system critical code from destructive viruses, inadvertent overwriting or other undesired alteration. Data integrity is also important for such code and data as device drivers, read only memory (ROM)-executable operating system code, and software application code, for example.

Some prior flash memory devices have protected boot code from being corrupted through use of a boot block architecture having a "lockable" boot block of memory. The boot block is programmed with a programming voltage applied to a particular pin on the device. Once programming has been completed and the programming voltage is removed, the boot block cannot be written to or erased, and thus is considered to be locked. System recovery code may be stored in a another lockable block on the memory in a similar manner. (System recovery code is provided such that a system may be recovered in the case of a catastrophic system error.)

A drawback of this approach is that if the boot code, for example, needs to be updated, it is not possible to reprogram the part because the block(s) that include the code are locked. Where the part can be reprogrammed, it is usually necessary to re-apply the programming voltage, typically 12 volts, to the same pin on the flash memory device to which the programming voltage was applied to program the part. In many cases, however, application of the programming voltage to this pin requires a user to open up the system that includes the flash memory to physically move a jumper on a system board. Requiring a system user to open up a system to enable re-programming of a flash memory is undesirable for many reasons including potential harm to other components in the system, voiding product warranties, etc.

For another approach, a flash memory is divided into symmetric blocks, each of which has an associated block lock bit formed of one or more flash memory cells. The blocks can each be locked by writing to the corresponding lock bit to prevent information stored in the blocks from being overwritten or erased. Locking the blocks makes the blocks operate as a read only memory (ROM).

For this approach, the locked blocks cannot be unlocked to provide for code updates, however, without applying the programming voltage of 12 volts to the block lock bits. Again, it may be necessary to physically move a jumper on a board to enable application of the programming voltage to unlock the block lock bits.

Further, in each of the above approaches, while system critical information is protected in locked blocks, updates to such information can be difficult. This difficulty can affect system ease of use and upgradeability. Also, it may be difficult to easily fix bugs in code stored in locked blocks.

SUMMARY OF THE INVENTION

A method and apparatus for controlling locking and unlocking of a block of memory cells in a memory array is described.

For one embodiment, a memory device includes a nonvolatile memory array including a first block of memory cells. A first volatile protection bit is coupled to the first block. The first volatile protection bit is programmable to prevent a memory access operation directed to the first block from being performed.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and apparatus for hardware locking and unlocking of a block of memory cells is described. Although the following embodiments are described with reference to a flash memory, alternative embodiments are applicable to other types of nonvolatile memories.

As will be described in more detail below, for one embodiment, a block of memory cells is selectively locked to disable write and erase operations to the block of memory cells or unlocked to allow write and erase operations to the block of memory cells using one or more volatile protection bits. For some embodiments, a block of memory cells can be locked or unlocked instantaneously. Further, for some embodiments, the block of memory cells may also be locked down such that its protection status cannot be changed by a software command alone and/or read locked to prevent information from being read from the block of memory cells. If the block of memory cells is locked down, it can be unlocked to enable write and erase operations to the block of memory cells in response to the detection of a system reset or other predetermined event.

For embodiments for which a block of memory cells may be unlocked in response to a system reset event, following a reset event, start-up code has exclusive control of the system for system initialization. Updates to information stored in previously locked and/or locked down blocks of memory can be made, and information stored in previously read locked blocks can be read, while the start-up code is in control. In this manner, viruses and other sources of data corruption are prevented from altering the information stored in the memory and/or reading information that is desired to be kept secret.

Before execution of the start-up code is complete, the start-up code relocks and/or re-locks down previously locked and/or locked down blocks. Additionally, the start-up code locks and/or locks down any other blocks that are desired to be locked and/or locked down based on the update. In this manner, read and/or write and erase operations to the locked down blocks are prevented before other software is able to run on the system.

Figure 1:
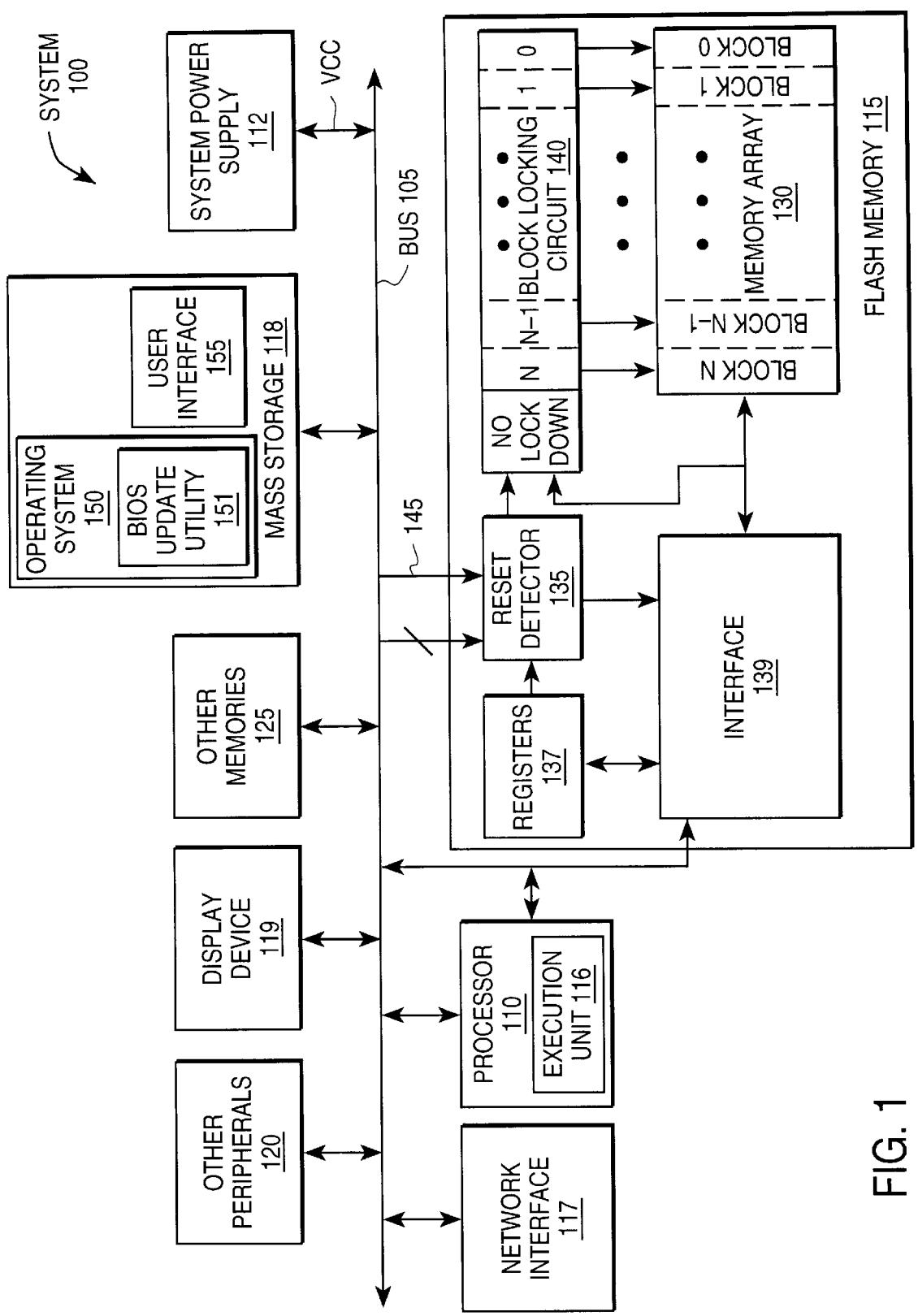
FIG. 1 is a block diagram of a system including a flash memory of one embodiment.

FIG. 1 shows a block diagram of a system 100 in which one embodiment may be implemented. The system 100 is a computer system, but other types of systems that may benefit from the capability to update system critical code, for example, may also be used for various embodiments.

The system 100 of FIG. 1 includes a system bus 105, a processor 110 coupled to the system bus 105, a system power supply 112 supplying a system voltage Vcc, and a flash memory 115, also referred to as a flash electrically programmable read only memory (EPROM), also coupled to the system bus 105. The processor 110 may be a microprocessor, a microcontroller, an application specific integrated circuit or another type of processor or controller. The processor 110 for the embodiment shown in FIG. 1 includes an execution unit 116 for executing instructions received by the processor 110 over the bus 105. The flash memory 115 includes a single flash memory device in the system 100 of FIG. 1, however multiple flash memory devices may also be used.

The system 100 may also include a network interface 117 to enable the system 100 to be coupled to one or more systems over a network. The network may be a local area network (LAN), a wide area network (WAN) or the Internet, for example. The system 100 may also include a mass storage device 118 such as a hard disk drive, a compact disc read only memory (CD ROM) drive or other type of drive and associated storage media (disk or CD ROM). A display device 119, other peripheral devices 120 such as an input device, for example, and other memories 125 such as a static random access memory (SRAM), dynamic random access memory (DRAM) and/or a read-only memory (ROM) may also be included in the system 100 and coupled to the bus 105.

The flash memory 115 of one embodiment includes a memory array 130, a reset detector 135, one or more registers 137, an interface 139 and a block locking circuit 140. Alternative embodiments may not include the registers 137.

The memory array 130 for one embodiment includes N+1 blocks of memory where N may be any non-negative integer. The memory array 130 is divided into blocks such that, for a memory erase operation, the entire memory array 130 does not need to be erased. Using blocks, information may be erased in one block without affecting information stored in the other blocks of the memory. For other embodiments, the memory array may not be divided into blocks. For these embodiments, the entire memory array is referred to herein as a block.

The blocks of the memory array 130 may all include the same number of memory cells or they may be different sizes. The blocks 0-N of the memory array 130, for one embodiment, each include 64 k bytes but may be larger or smaller for other embodiments. Each of the blocks 0-N of the memory array 130 can be individually locked to prevent programming and/or erasure of data stored in the block and/or unlocked as described in more detail below. Additionally, for some embodiments, each of the blocks 0-N can be locked down to prevent the protection status of the block from being changed by a software command alone. A locked down block, like a locked block, cannot be programmed or erased.

The block locking circuit 140 of one embodiment includes a block locking circuit corresponding to each of the blocks 0-N of the memory array 130. The block locking circuit 140 controls locking and unlocking of the blocks of the memory array 130 as well as lock down of the blocks of the memory array 130 for embodiments including this feature. The reset detector 135, register(s) 137 and interface 139 are described in more detail with reference to FIG. 3.

For the example shown and described in reference to FIG. 1, one or more mass storage device(s) 118 stores an operating system 150 and a user interface 155. The operating system 150 and user interface 155 may be a Windows® operating system from Microsoft Corporation, a UNIX operating system, or another type of operating system (Windows is a registered trademark of Microsoft Corporation). The operating system 150 of one embodiment includes a BIOS update or other code update utility 151. The user interface 155 is software that enables a user to interface with the system 100 and may be a graphical, text-based or other type of user interface.

Figure 8:
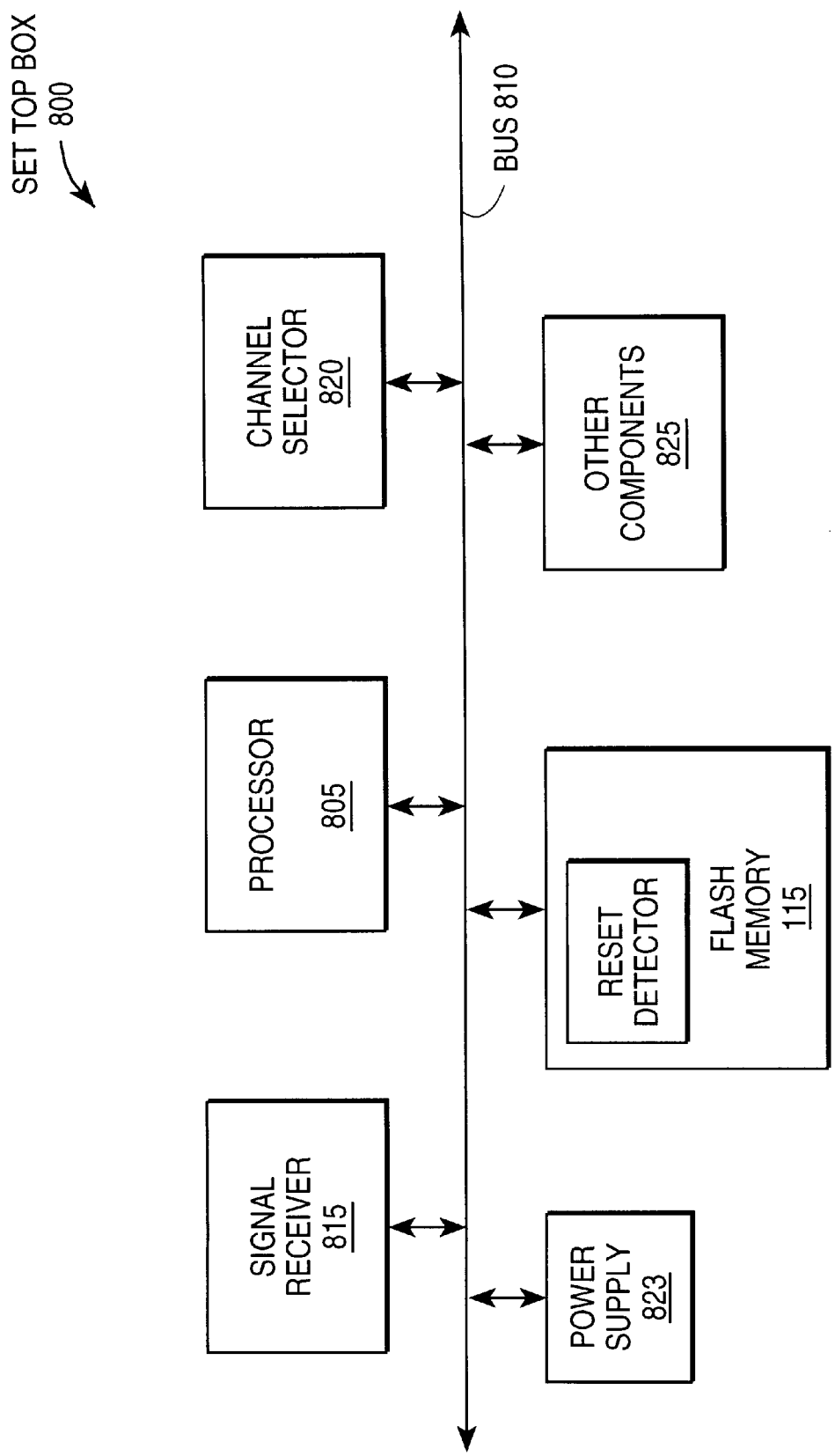
FIG. 8 is a block diagram of a set top box including the flash memory of one embodiment.
Figure 9:
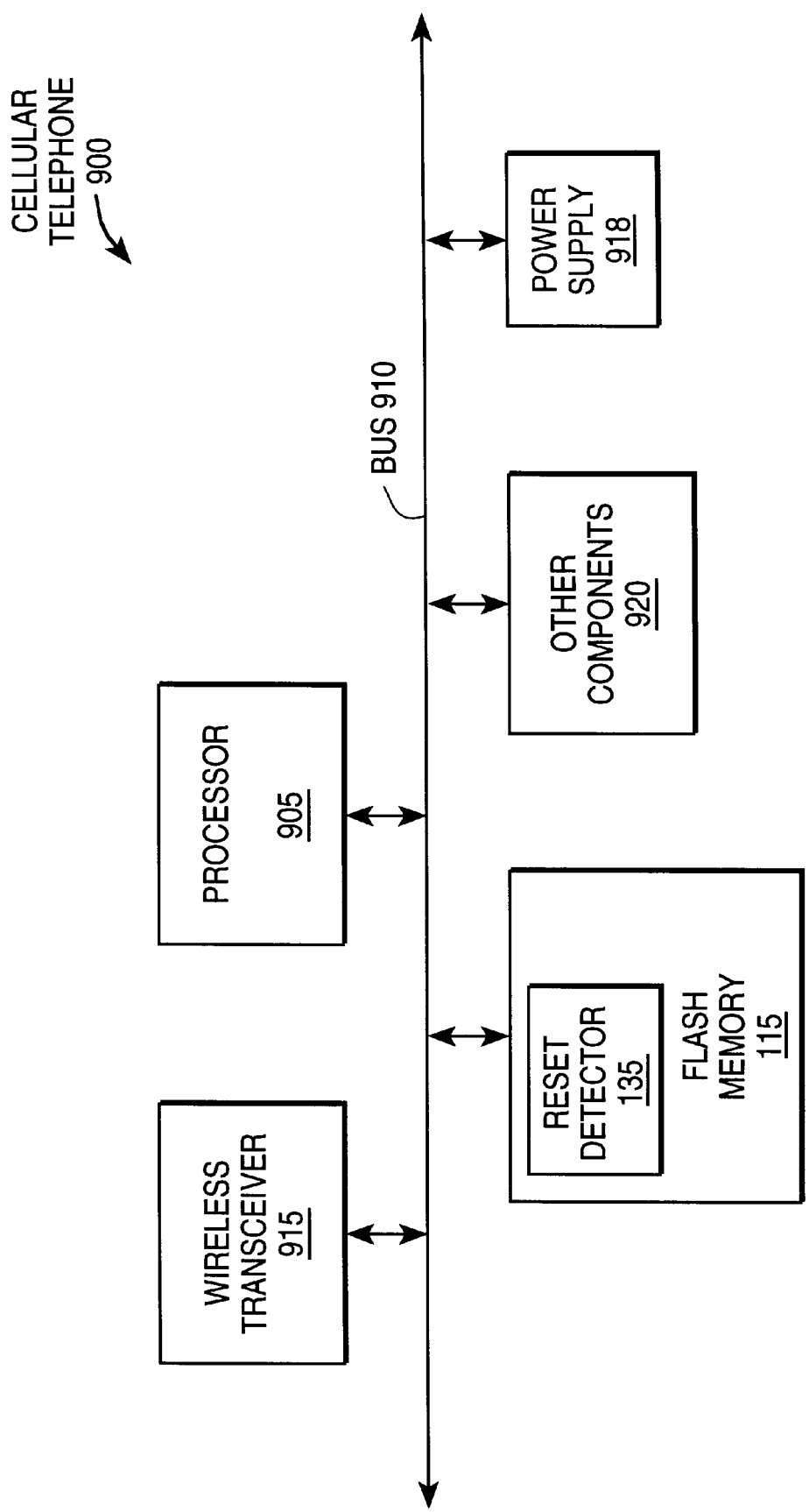
FIG. 9 is a block diagram of a cellular telephone including the flash memory of one embodiment.

FIGS. 8 and 9 are block diagrams showing examples of other types of systems that may use the flash memory 115 of one embodiment. FIG. 8 shows a set top box 800 including the flash memory 115 and a processor 805 coupled to a bus 810. The flash memory 115 in this example, may be used to store start-up code or other instructions for the processor 805, for example. The set top box 800 also includes a signal receiver 815, a channel selector 820, a power supply 823 and other components 825. Other set top boxes configured in a different manner may also be used for various embodiments.

FIG. 9 shows a cellular telephone 900 including the flash memory 115 and a processor 905 coupled to a bus 910. The flash memory 115 in this example, may be used to store instructions for the processor 905 and/or to store data such as telephone numbers, for example. The cellular telephone 900 also includes a wireless transceiver 915 to enable communications to and from the cellular telephone 900, a power supply 918 and other components 920. Other cellular telephones configured in a different manner may also be used for various embodiments.

Each of the above systems can be reset and/or experience a power cycle in the same manner as the system 100 of FIG. 1.

Figure 2:
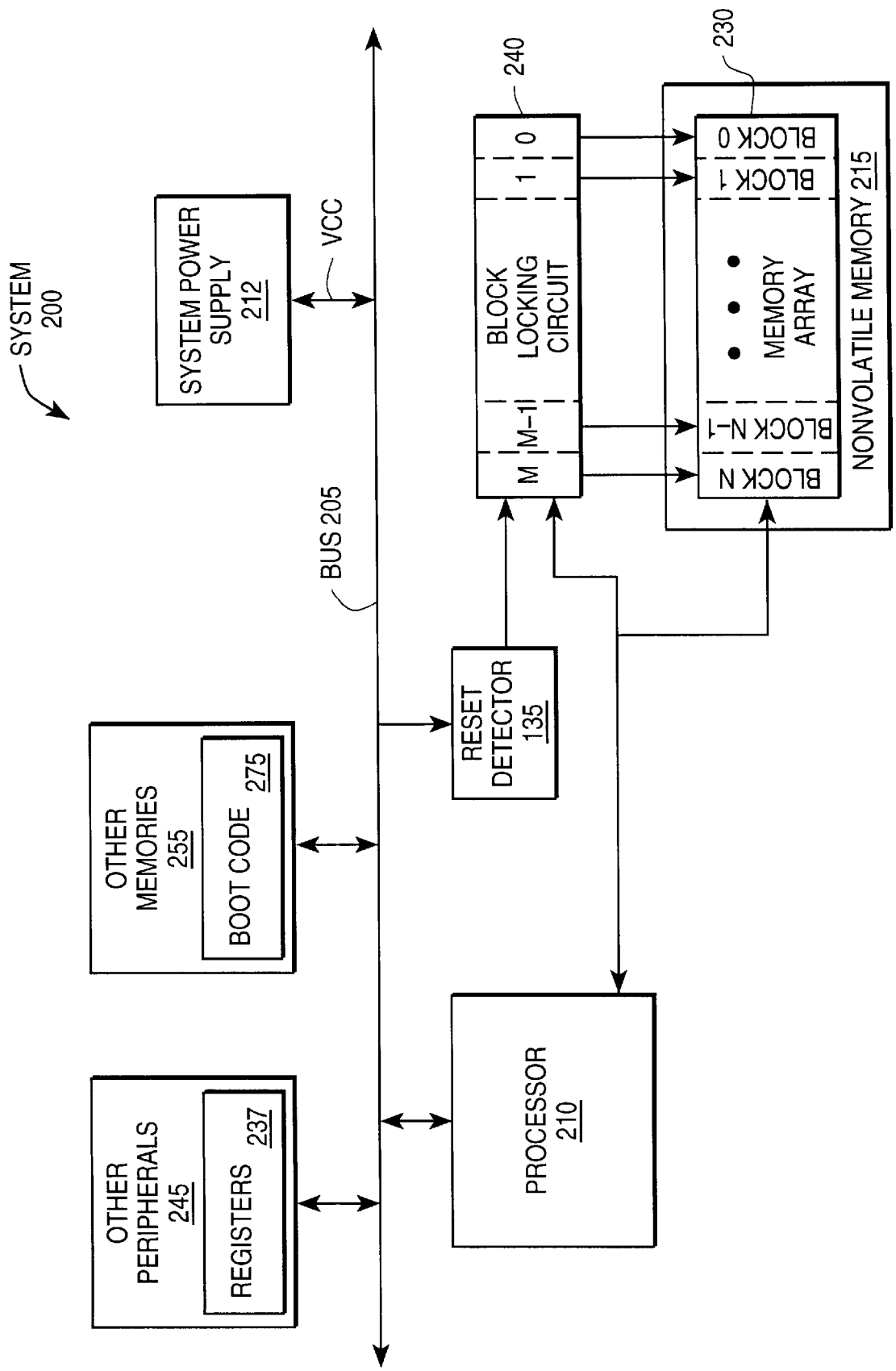
FIG. 2 is a block diagram of a system of one embodiment including a reset detector, a block locking circuit and a nonvolatile memory.

FIG. 2 is a block diagram of another system 200 for which another embodiment may be implemented. The system 200, like the system 100 of FIG. 1 may be a computer system or any one of a variety of other types of systems.

The system 200 includes a system bus 205, a processor 210 coupled to the system bus 205, a system power supply 212 supplying a system voltage Vcc, and a nonvolatile memory 215 also coupled to the system bus 205. The nonvolatile memory 215 includes a memory array 230 arranged in blocks 0-M (where M is any non-negative integer) and may be a flash memory or another type of nonvolatile memory.

For the embodiment shown in FIG. 2, a standalone reset detector 235 is coupled to the bus 205 and to the nonvolatile memory 215 through a standalone block locking circuit 240. One or more registers 237 are provided in a chipset or other peripheral 245. The reset detector 235, register(s) 237 and block locking circuit 240 operate in a similar manner and perform functions similar to elements in FIG. 1 having the same names.

Also for the embodiment shown in FIG. 2, the boot code or other start-up routine 275 is stored in a memory 255 other than the nonvolatile memory 215. For other embodiments, the start-up routine may be stored in the nonvolatile memory 215.

Figure 3:
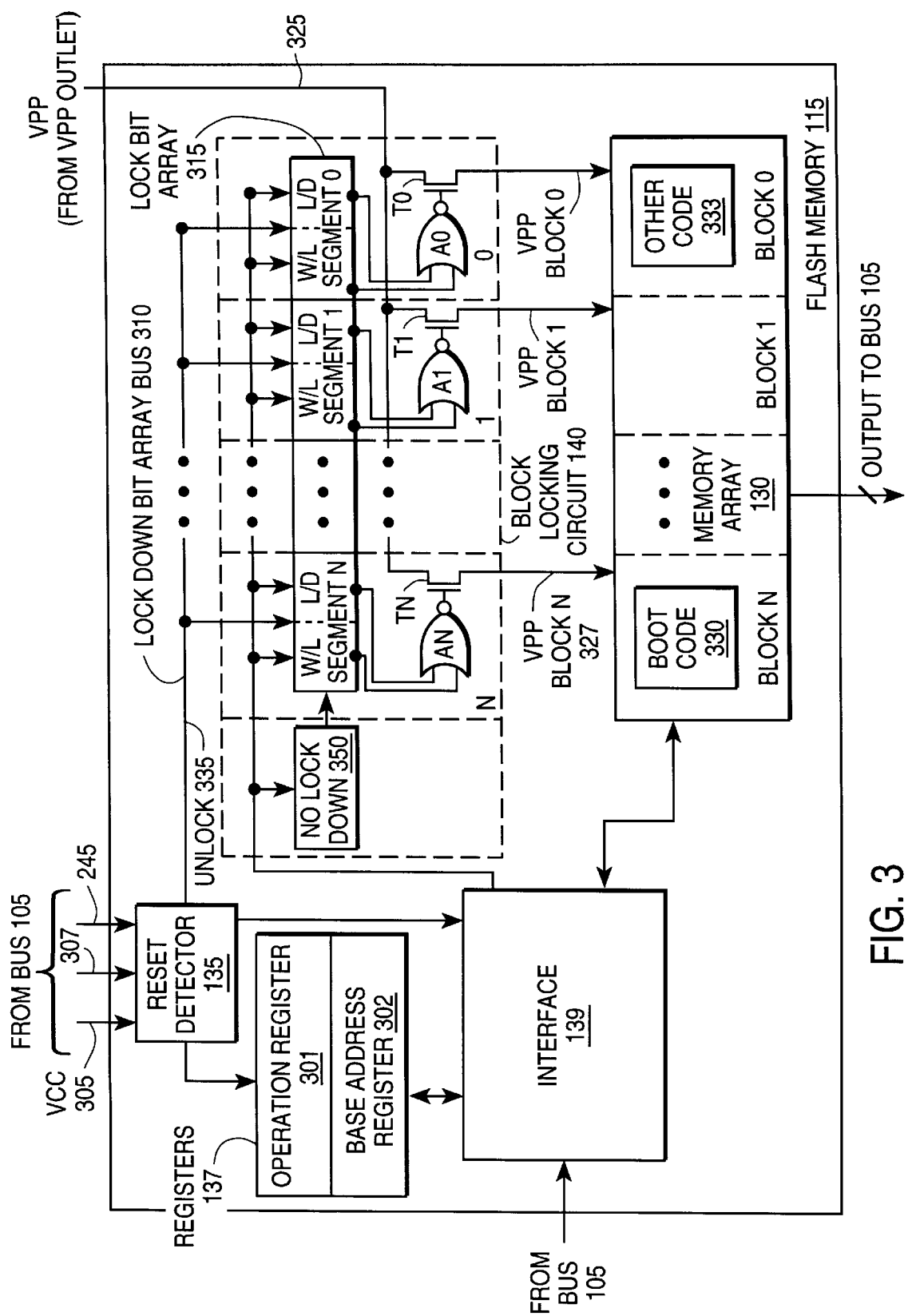
FIG. 3 is a block diagram of the flash memory of FIG. 1 including blocks of memory cells that may be locked using the hardware block locking method and apparatus of one embodiment.

While the description that follows in reference to FIG. 3 describes the operation and details of the system 100 of FIG. 1, it will be appreciated that like components shown in the system 200 of FIG. 2 operate in a similar manner.

FIG. 3 is a block diagram of the flash memory 115 of FIG. 1. For the embodiment shown in FIG. 3, the register(s) 137 include two registers: an operation register 301 and a base address register 302. The registers 137 may be used during a code update process, for example, to indicate the type of code update process to be performed, and the address at which the new code can be found, respectively. A different number of registers may be used for alternative embodiments. The registers 137 of one embodiment are not cleared by a reset event, but only by a power cycle as described in more detail below. Thus, the registers 137 may be used for purposes such as passing messages through a reset event, for example.

The reset detector 135 of one embodiment is coupled to receive a reset signal 145 from the bus 105 (FIG. 1). The reset signal 145 indicates the occurrence of a system reset event. The reset detector 135 of one embodiment is also coupled to receive a system Vcc signal 305 from the bus 105 and may receive other signals including a signal from a discrete pin 307 in response to which it is desirable to assert an unlock signal as described below. A first output of the reset detector 135 is coupled to a lock-down bit array bus 310 which is coupled to a lock bit array 315 included in the block locking circuit 140. A second output of the reset detector 135 is coupled to the registers 137 and a third output is coupled to the interface 139.

The interface 139 includes a command interface and a write state machine. The command interface operates to receive, latch and decode memory access and other commands from the bus 105. Once the commands are decoded, the interface 139 generates signals used by other circuits in the flash memory device 115 in order to perform the commands. The write state machine controls memory read write and erase operations in response to commands received by the command interface. The interface 139 is coupled to the register(s) 137, the lock bit array 315 of the block locking circuit 140, the reset detector 135 and the memory array 130.

The block locking circuit 140 includes the lock bit array 315, a no lockdown bit 350, and gating logic coupled to the lock bit array 315. The lock bit array 315 of one embodiment is formed of static random access memory (SRAM) cells that can be programmed and erased without the application of a 12 volt programming voltage or a programming voltage greater than the operating voltage of the flash memory 115. In this manner, the bits of the lock bit array 315 can be programmed and erased without requiring a user to move a jumper or otherwise reapply a higher programming voltage to a particular pin on the flash memory 115. For another embodiment, the lock bit array is formed of another type of volatile memory cell such as a dynamic random access memory (DRAM) memory cell or a simple flip-flop or latch, for example.

For the embodiment shown in FIGS. 1 and 3, the lock bit array 315 includes two protection bits associated with each block of the memory array 130 although a different number of protection bits may be used for other embodiments. The protection bits of the lock bit array 315 that correspond to a particular block of memory are referred to collectively as a segment of the lock-bit array. Thus, the protection bits of the lock bit array 315 are arranged in segments 0-N to correspond respectively to blocks 0-N of the memory array 130.

Each set of protection bits stores a value indicating the protection status of the corresponding block of the memory array, wherein the protection status is one of three states: locked, unlocked or locked-down. A first protection bit, referred to herein as the write lock (W/L) bit, indicates whether the corresponding block is locked to prevent write and erase operations or unlocked. A second protection bit indicates whether the corresponding block is locked down or not and is referred to as the lock-down (L/D) bit.

A block of the memory array 130 that is write locked is prevented from being accessed for program or erase operations, but information stored in the write locked block can be accessed in response to a memory read operation. In this manner, information stored in a write locked block cannot be altered unless the protection status of the block is changed.

A block of the memory array 130 that is unlocked can be accessed for program, erase and read operations. For one embodiment, the write lock bit corresponding to a particular block of the memory array can be re-programmed to change the write protection status of the block at any time using software commands.

If a block of memory is locked down, similar to the case of the write locked protection status, the block cannot be accessed for memory program and erase operations for one embodiment. The lock-down (L/D) bits, however, are one-way writeable bits such that the protection status of a locked down block cannot be changed using software commands alone. A specific signal must be asserted or a specific event such as a reset or power down event must be detected before the lock-down status can be changed as described below.

Some embodiments also include a no lock-down bit 350 coupled to the lock bit array 315 and to the interface 139. The no lock-down bit 350 is also a one way writeable bit that may be set to prevent the state of any of the write lock and/or lock-down bits in the lock bit array 315 from being altered. In this manner, the memory array 130 can provide more protection from viruses that could attempt to lock down the entire memory array 130. For one embodiment, the no lock-down bit 350 is one time programmable per power cycle and may be cleared through a reset or other predetermined event. For other embodiments, the no lock-down bit 350 may not be included or a no lock-down bit per block of memory cells may be provided.

In addition to the lock bit array 315 and the no lock-down bit 350, the block locking circuit 140 of one embodiment includes additional gating logic corresponding to each of the segments of the lock bit array 315. For the embodiment shown in FIG. 3, the block locking circuit 140 includes a NOR gate and a transistor gate coupled to and corresponding to each of the protection bit segments of the lock bit array 315.

For example, for the embodiment shown in FIG. 3, a NOR gate $A_N$ corresponding to segment N of the lock bit array 315 has a first input coupled to receive the value of the write lock (W/L) bit of the segment N of the lock bit array 315. A second input of the NOR gate $A_N$ is coupled to receive the value of the lock-down (L/D) bit of the segment N of the lock bit array 315.

An output of the NOR gate $A_N$ is coupled to a gate of the transistor $T_N$. A second terminal of the transistor $T_N$ is coupled to an internal or external Vpp source (not shown) and a third terminal of the transistor $T_N$ is coupled to a Vpp input 327 of the block N of the memory array 130. The Vpp source provides the potential (Vpp) over a bus 325. Vpp is the potential required to program and/or erase information stored in the memory cells of the memory array 130. The cells in the block N of the memory array 130 cannot be programmed or erased unless the Vpp input 327 of the block N receives the programming potential Vpp.

Similar logic is coupled in a similar manner between each individual remaining segment in the lock bit array 315 and the corresponding block in the memory array 130. That is, each of the NOR gates $A_O$-$A_N$ has one input coupled to receive the value of the write lock bit of the corresponding lock bit segment and the other input coupled to receive the value of the lock-down bit of the corresponding lock bit segment. Each of the transistor gates has a first terminal coupled to receive the output of the corresponding NOR gate, a second terminal coupled to receive the Vpp potential over the bus 325 and a third terminal coupled to the Vpp input of the corresponding block in the memory array 130.

It will be appreciated that alternative embodiments may not use gating logic such as that described above to block Vpp. For some such embodiments, the flash memory interface is instead configured to check the lock bit array for each memory access operation it receives to determine whether to allow the operation. For example, if a memory erase operation directed to block N (FIG. 3) is received by such an interface, the interface would check to see whether the write lock or lock down bit of block N has been set. If so, the interface would not allow the operation to proceed.

It will be appreciated that the flash memory 115 includes other logic blocks and circuitry not shown in FIG. 3 such as read and write control circuitry, output circuitry and address decoding logic, for example.

Figure 4:
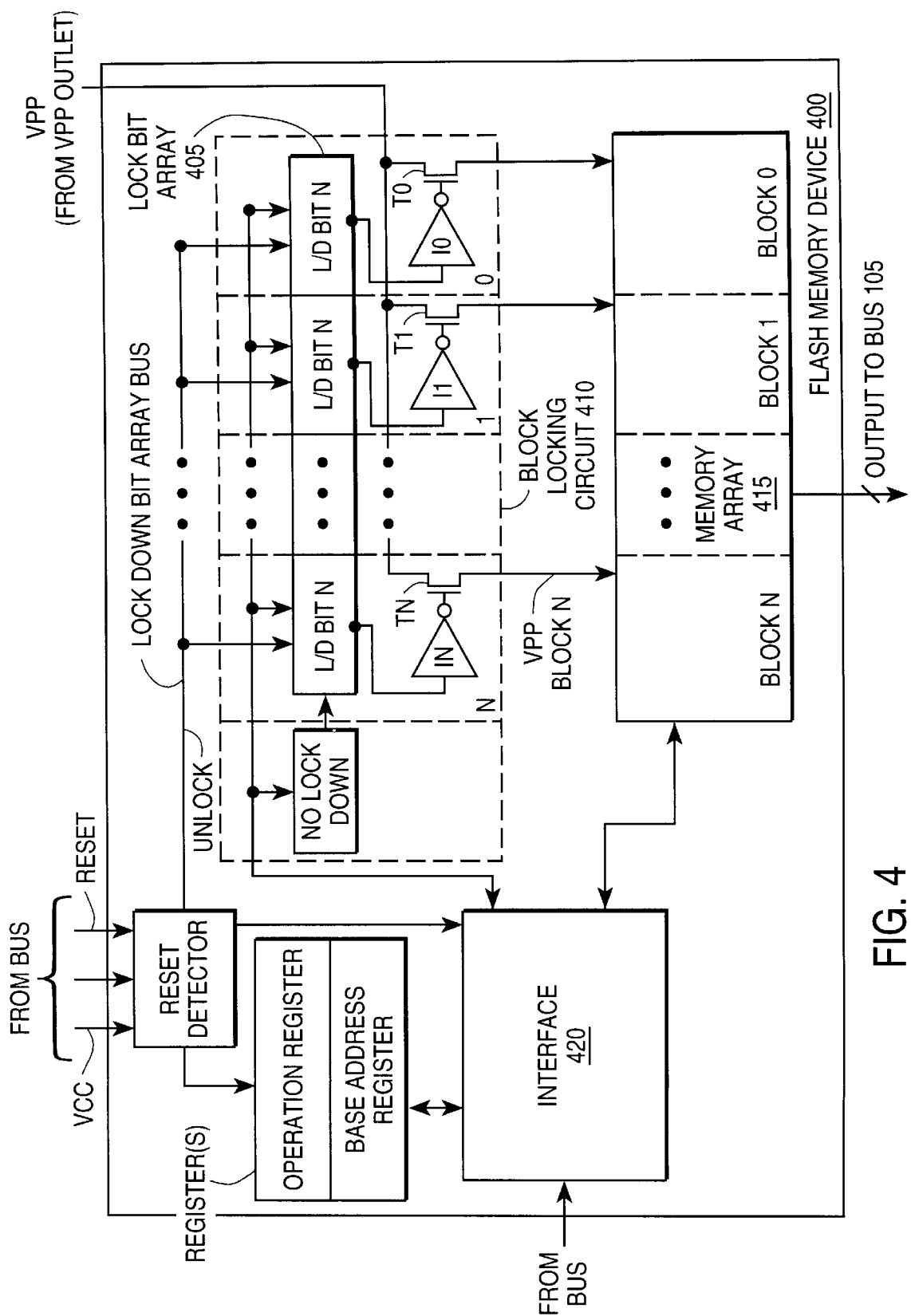
FIG. 4 is a block diagram of a flash memory of another embodiment including an alternative embodiment of a block locking circuit.

FIG. 4 is a block diagram showing a flash memory device 400 of another embodiment. For the embodiment shown in FIG. 4, a lock bit array 405 of the block locking circuit 410 includes only a lock-down (L/D) bit (and not a write lock bit) corresponding to each of the blocks 0-N of the memory array 415. The single lock-down bit is used to indicate whether the corresponding block of the memory array 415 is locked down or not locked down. The lock-down bits 0-N of the lock bit array 405 are one-way writeable like the lock-down bits of FIG. 3. In this manner, a reset event is required to change the protection status of the corresponding block such that information stored in a locked-down block cannot be inadvertently or maliciously altered.

The inverters $I_O$-$I_N$ coupled to each of the lock-down bits 0-N, respectively, in cooperation with the transistors $T_O$-$T_N$ gate Vpp to the corresponding block of the memory array 415. Thus, the programming voltage Vpp can only be applied to one of the blocks 0-N if the corresponding L/D bit is not set.

Different numbers of lock bits per segment may be used for other embodiments. Further, other logic gates may be used in place of the inverters shown in FIG. 4. Alternatively, gating logic may not be used and the interface 420 may instead check the lock bit array 405 to determine whether a write or erase operation directed to a particular block can proceed. For embodiments that use a different number of lock bits per segment than described with reference to FIG. 3 or FIG. 4, the corresponding gating logic will be implemented in another manner to provide similar functionality.

Figure 7:
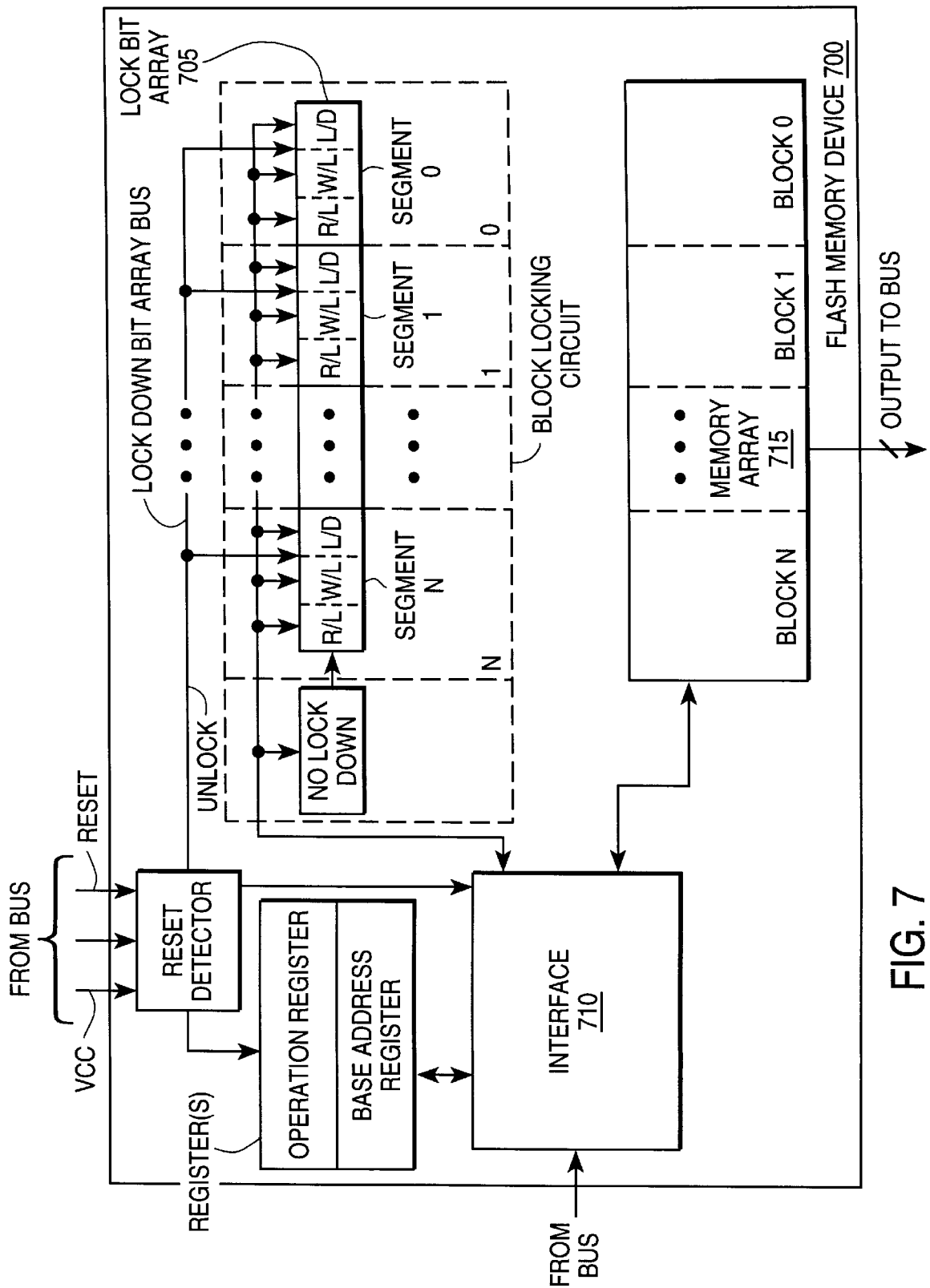
FIG. 7 is a block diagram of a flash memory of another embodiment including another alternative embodiment of a block locking circuit.

FIG. 7 shows a flash memory 700 of another embodiment including a lock bit array 705 of another embodiment. The lock bit array 705, in addition to the write lock and lock down bits shown in and described with reference to FIG. 3, includes a read lock (R/L) bit in each segment of the lock bit array. The R/L bit prevents a corresponding block from being accessed in response to a memory read operation directed to that block.

For this embodiment, if the interface 710 receives a memory read operation directed to block N of the memory array 715, for example, the interface 710 will determine whether the R/L bit of segment N of the lock bit array 705 is set. If it is set, the interface 710 will prevent the memory read operation from proceeding. For this embodiment, the interface 710 operates in a similar manner to determine whether write and erase operations can proceed based on whether the corresponding write lock and/or lock down bit(s) are set. For an alternative embodiment, gating logic such as that shown in FIG. 3 may be used to gate Vpp for write or erase operations.

The read lock bits of this embodiment are software programmable in the same manner as the write lock bits described above with reference to FIG. 3. For an alternative embodiment, the read lock bits may be one-way writeable such that a reset or other predetermined system event is required in order to clear them in the same manner as the lock down bits described with reference to FIG. 3.

The read lock bits may be used to prevent information from being read from the flash memory for any one of a variety of reasons. For example, the read lock bits may be used to protect information from being read by a virus.

Referring back to FIG. 3, the operation of the reset detector 135 and the block locking circuit 140 to write lock, unlock and lock-down blocks of the memory array 130 is now described. For purposes of example, it is assumed that system critical information is stored in blocks 0 and N of the memory array 130, and that it is therefore important to prevent any undesired alterations to the information stored in blocks 0 and N of the memory array.

Specifically, for this example, boot code 330 or another start-up routine is stored in block N while other system critical code 333 is stored in block 0. Boot code 330 begins with the first instruction executed when a processor is powered up or rebooted. The boot code 330 is executed each time the computer is powered on or reset. For this example, it is also assumed that the remaining blocks of the memory array 130 are unlocked and thus, can be freely accessed for memory write and erase operations.

To lock blocks 0 and N, the write lock bits of the segments 0 and N of the lock bit array 315 are programmed to a logical 1. This step is also referred to herein as "setting" the write lock bits. The write lock bits associated with the remaining blocks that are not desired to be write locked are programmed to store a logical 0. For another embodiment, the write lock bits are set to write lock the corresponding block of memory as a default and only the bits corresponding to the blocks to be unlocked are programmed.

Because blocks 0 and N store system critical information in this example, it is also desirable to lock down blocks 0 and N such that their protection status cannot be easily changed. For purposes of this example, however, only block 0 is to be locked down while block N is write locked but not locked down. For this embodiment, a lock-down bit is set by storing a logical 1 in the lock-down bit cell.

The write lock bits and the lock-down bits of the lock bit array may be programmed by the boot code or other start-up routine 330. Alternatively, the write lock bits can be programmed at any time by a user through a command sequence communicated to and received by the interface 139. The lock-down bits may be set on the fly by a user, but they may not be cleared except during a power down or reset sequence or, for some embodiments, in response to assertion of a particular signal as described below.

Referring to FIGS. 1 and 3, the processor 110 generates various memory read, write and erase requests directed to the flash memory 115. These memory access requests are communicated to the flash memory 115 over the bus 105 and received by the interface 139. Memory read requests received by the flash memory interface 139 are processed regardless of the protection status of the block of the memory array 130 to which they are directed. Thus, even though blocks 0 and N of the memory array 130 have been locked by setting the corresponding lock bits in the lock bit array 315, read operations directed to the blocks 0 and N may still be performed.

Memory write and erase requests received by the flash memory 115 that are directed to blocks of the memory array 130 other than the blocks 0 and N are also processed. Memory write and erase requests directed to the write locked blocks 0 and N, however, are prevented from being processed in the manner described below.

Using block 1 and the corresponding logic in the block locking circuit 140 as an example, the write lock bit of the lock bit array 315 corresponding to unlocked block 1 indicates a logical 0 as described above. Further, the lock-down bit corresponding to the unlocked block 1 also indicates a logical 0. Thus, the output of the NOR gate $A_1$ (having one input coupled to the write lock bit and another input coupled to the lock/down bit of the segment corresponding to the block 1) is high, turning on the gate $T_1$. Turning on the gate $T_1$ allows the Vpp potential from the bus 325 to be applied to block 1 of the memory array 130 such that program and erase operations directed to block 1 may be performed. Other unlocked blocks in the memory array 130 are responsive to write and erase requests in a similar manner.

In contrast, a write or erase request directed to a write locked block, block N in this example, cannot be serviced. As described, the write lock bit of the lock bit array 315 corresponding to block N has been programmed to a logical 1. The output of the NOR gate $A_N$ is therefore low in this example because a first input of the NOR gate $A_N$ coupled to the lock bit N is high. Because the output of the NOR gate $A_N$ is low, the gate $T_N$ is not turned on and the Vpp potential from the bus 325 is prevented from being applied to the block N.

Without the Vpp potential being applied to the block N, write (or program) and memory erase operations directed to the block N are prevented from being performed. In this manner, the block N is write locked, thereby protecting information stored in block N from undesired alteration or corruption.

Program and erase operations directed to the locked down block 0 are similarly prevented. The lock-down bit corresponding to the block 0 has been programmed to a logical 1 as mentioned above. In this case, the write lock bit corresponding to the block 0 has also been programmed to a logic 1. Thus both inputs of the NOR gate $A_0$ are high such that the output of the NOR gate $A_0$ is low and the transistor $T_0$ is not turned on. The programming potential Vpp cannot be applied to the block 0 and write and erase operations to block 0 are thus prevented. Other locked and/or locked down blocks are prevented from being accessed for memory write and erase operations in a similar manner.

While a locked or locked down block of memory prevents information stored in the block from being inadvertently altered, there may be circumstances where it is important for a computer system user or other system user to change or update information that is stored in a locked or locked down block.

For instance, in the example described with reference to FIG. 3, block N is locked and block 0 is locked down to protect system critical information stored in the blocks from undesired alterations by a virus or other source. If, however, an update to the information stored in either block 0 or block N is required for any reason, it is useful to be able to make the desired changes. In the case of the locked down block 0, it is desirable to be able to do so while still being able to protect the information from viruses or inadvertent alteration, for example.

Block N is write locked as described above, but not locked down. Therefore, to change information stored in the block N, the protection status of the block is changed by clearing the write lock bit corresponding to the block N in the same manner in which it was programmed. In this manner, program and/or erase commands to the block N are enabled.

The block 0, however, is locked down in this example. If information stored in the block 0 is to be changed, the lock-down bit corresponding to the block 0 must be cleared. With continuing reference to FIGS. 1 and 3, the reset detector 135 operates in conjunction with the block locking circuit 140 to allow changes to information stored in locked down blocks of the memory array 130 while still helping to protect the information from erroneous or malicious alterations. For one embodiment, the reset detector 135 detects a reset or other predetermined event and, in response to the event, the lock-down bits of the lock bit array 315 are cleared. In this manner, the protection status of a block can be changed and changes may be made to the information stored in the previously locked-down block(s) before they are re-locked by software as described below.

The reset detector 135 receives a reset signal 145 from the bus 105 of FIG. 1. The reset signal 145 is asserted whenever a soft or hard reset to the system 100 of FIG. 1 is indicated for one embodiment. In the case where the system 100 is a computer system, the reset signal 145 may be asserted, for example, if a reset button on the computer system is pressed or if a "warm reboot" operation is indicated by the operating system 150 (FIG. 1).

The reset detector 135 of one embodiment is also coupled to receive a system Vcc signal 305 from the bus 105 shown in FIG. 1. The reset detector 135 for this embodiment includes a voltage detector (not shown) to detect the system voltage level indicated by the system Vcc signal 305. In some cases, the system 100 is reset by powering the system 100 down and then powering it up again. Where the system 100 is reset in this manner, the Vcc signal 305 drops from the system operating voltage (Vcc), about 3.3 volts for one embodiment, to ground when the system 100 is powered down. When the system 100 is powered up again, the Vcc signal changes from ground back to the stable system operating voltage, Vcc.

For one embodiment, the reset detector 135 detects a reset event when the system Vcc signal 305 drops below a predetermined level indicating a system reset is in process. The predetermined level is dependent on the particular system in which the flash memory is located. For this embodiment, the reset signal 145 remains asserted to indicate a system reset event until the Vcc signal 305 stabilizes at the system operating voltage after being powered up. For an alternative embodiment, a reset detector may instead detect when the Vcc signal transitions from a low level to a predetermined higher level as it moves toward the stable system operating voltage Vcc after being powered up.

Other indicators of reset events such as a discrete reset command, or a particular control signal not shown in the Figures may also be received and recognized as a reset event by the reset detector 135. Further, the reset detector 135 may receive other control signals that do not necessarily indicate a reset event, but are only asserted in particular circumstances. A discrete pin on the flash memory device 115 (FIG. 1), for example, may be coupled to provide a signal received by the reset detector 135 and thus, may be used to override or clear the lock-down bits of the lock bit array 315.

For the embodiment shown in FIG. 3, in response to the reset signal 145 being asserted and/or the system Vcc signal 305 dropping below a predetermined level, the reset detector 135 asserts an unlock signal 335 on the lock bit array bus 310. The unlock signal 335 clears all of the lock-down bits in the lock bit array 315 and sets all of the write lock bits to write lock all blocks. In this manner, the protection status of all of the blocks in the memory array 130 can be changed through software commands while the information stored in the memory array 130 is protected from erroneous changes. For embodiments such as the embodiment shown in FIG. 4 for which a single bit in the lock bit array 405 is used to control the protection status of each block in the memory array 415, clearing the lock-down bits causes all blocks to be unlocked and accessible for program and erase operations. Where a read lock bit is used, the read lock bit may be controlled in the same manner as the write lock bit for one embodiment.

Further, if the system is powered down, the registers 137 are cleared, invalidated or the information stored in them is otherwise lost. For one embodiment, after the system is powered down, the reset detector 137 detects when the system is powered up again and causes the registers 137 to be programmed to a known state. For one embodiment, both the operation register 137 and the base address register 302 are programmed to store zeroes on power up so that an update or other operation indicated by the operation register 301 is not erroneously performed. One or more flip-flops or other storage elements (not shown) may be used to hold the value stored in the registers 137 on power up.

With continuing reference to FIG. 3, immediately following a reset or other predetermined event, the system 100 executes the boot code 330 to initialize the system 100 for operation. If the reset event detected by the reset detector 135 is a system power down, the boot code 330 is executed as soon as the system 100 is powered up again.

The boot code 330 maintains exclusive control of the system 100 during its execution. Thus, while the boot code 330 or other system start-up routine is executing, viruses, system software and/or other processor commands cannot alter the information stored in the memory array 130 unless the boot code 330 specifically provides for changes. If changes are specifically provided for, the changes are made while the boot code 330 still has control of the system. For such embodiments, the boot code 330 then locks down and/or locks the previously locked-down and/or locked blocks, as well as any other blocks to be locked or locked-down based on the changes made to information stored in the memory array.

For embodiments for which the reset detector is responsive to a control signal, such as a write protect signal, or another control signal from a discrete pin, the system is not necessarily restarted. In order for the write protect or other control signal to be asserted, however, an authentication or verification scheme may be used to ensure that the particular control signal is not being asserted inadvertently or by a malicious program.

Figure 5:
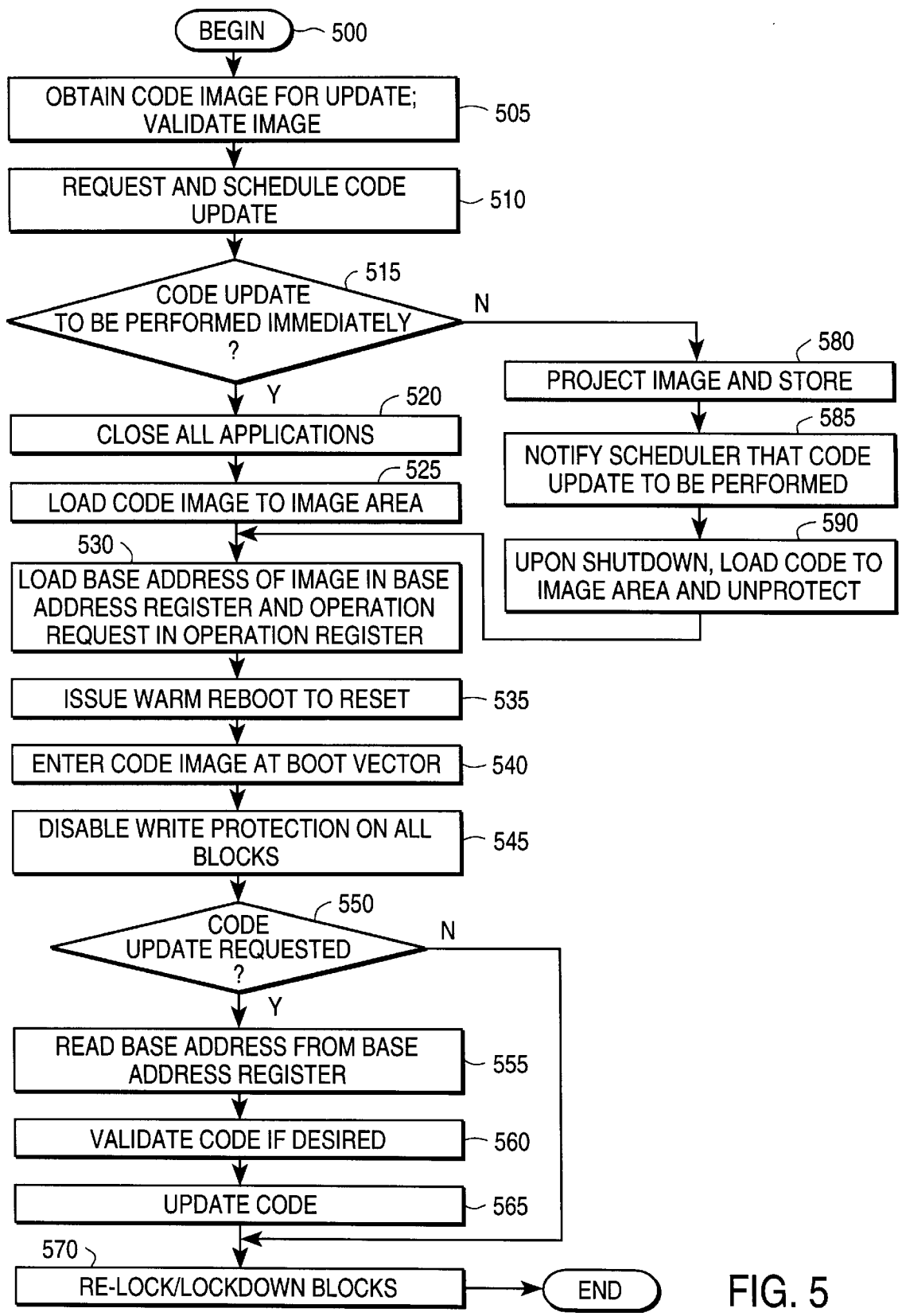
FIG. 5 is a flow diagram showing the code update method of one embodiment.

It may be desirable under certain circumstances to be able to update or make changes to code stored in write-protected (in this case locked down) blocks of a memory array. A code update method of one embodiment is described in detail with reference to FIGS. 1, 3 and the flow diagram of FIG. 5. The method begins at step 500 and describes a BIOS update for purposes of illustration. The BIOS in this case is part of the boot code. Other types of code may be updated in a similar manner.

At step 505, the computer system 100 or computer system user obtains a code image, a BIOS image in this example, to be used to update code previously stored in the memory array 130. The image may be obtained from a mass storage device 118 such as a floppy drive, or over a network or from the World Wide Web through the network interface 117, for example. Once retrieved, the code image is stored in a memory 125 such as DRAM main memory. The code image retrieval process of one embodiment is controlled by the operating system 150. Other methods for obtaining the code image may also be used.

Figure 6:
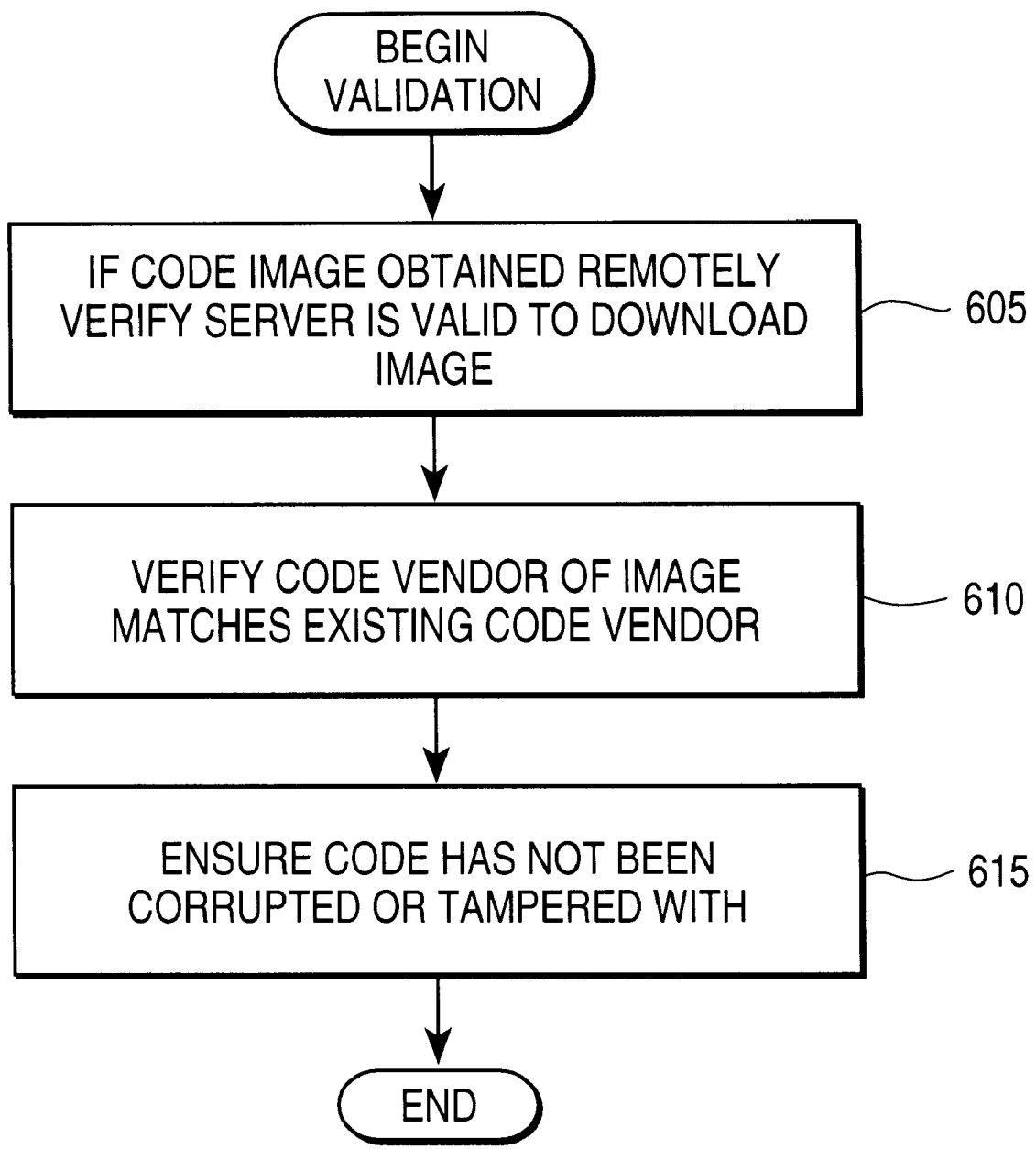
FIG. 6 is a flow diagram showing a code validation method that may be used in the code update method of FIG. 5.

At this time or another time during the BIOS update process, the code image may be validated. The validation process for one embodiment is described in more detail with reference to FIGS. 1, 3 and 6.

The validation process includes a step 605 of verifying that a server on a network with which the computer system 100 communicates over the network interface 117 is a valid computer system from which to download the code image. This step could involve a challenge using passwords or keys and is only performed when the code image is obtained from other than main memory. The validation process may also include a step 610 of verifying that the vendor of the code image matches the vendor of the existing code previously stored in the memory array 130. A public key of the boot block, for example, may be used to validate the origin of a BIOS signature. The validation process may also include a step 615 of ensuring the code image has not been tampered with or that its integrity has not otherwise been compromised. This step may include recomputation of a digest of the code image and comparison with a digest value of the code image signature. Other approaches for verifying the code integrity, such as a checksum, or other type of digital signature, for example, may also be used. If the code image is validated the process continues, otherwise the code is not updated.

Referring back to FIGS. 1, 3 and 5, at step 510, a BIOS update is requested and scheduled. This step may be performed before or after the retrieval and validation of the code image at step 505. For one embodiment, the BIOS update request and scheduling process is controlled by the operating system 150 through the user interface 155. The operating system 150 of one embodiment includes a BIOS or code update utility 151. For a Windows® operating system, this utility may be included as part of the Control Panel, for example. The code update may be requested and scheduled by a computer system 100 user or remotely over a network via the network interface 117.

At decision block 515, it is determined whether the code update is to be performed immediately or whether it has been scheduled for a later time such as upon shutdown. If the code update is to be performed immediately, then at step 520, all applications running on the computer system 100 are closed and at step 525, the code image is loaded to an image area. The image area may be a predetermined location in the main memory 125.

At step 530, the base address of the code image is stored in the base address register 302 and an operation request is stored in the operation register 301. The base address indicates the location in the main memory 125 at which the code image is stored. The operation request may be stored in the form of a command code that indicates the specific type of code update to be performed. For example, one type of request may be a BIOS update request.

At step 535, a warm reboot is issued. The warm reboot may be issued by the operating system 150 in response to the BIOS update utility 151, for example. The warm reboot causes the reset signal 145 to be asserted for one embodiment and the boot code 330 to take control of the system 100.

At step 545, in response to the assertion of the reset signal 145 caused by the warm reboot of step 535, and while the boot code 330 has control of the system 100, the reset detector 135 asserts an unlock signal 335 on the lock down bit array bus 310. For one embodiment, the unlock signal 335 clears the lock-down bits of the lock bit array 315 while the interface 139 clears the write lock bits of the lock bit array 315 by reprogramming them to a logical 0. The contents of the registers 137 are not affected because, as described above, the registers 137 are not cleared by a reset event that does not involve a system power down.

At step 550, it is determined whether a code update has been requested. For one embodiment, this step is performed by reading the operation register 301 to determine whether a code update request is stored in the operation register. If so, then at step 555, the base address of the code image is read from the base address register 302 to determine where the update image is located in the main memory 125.

At step 560, any additional code validation is performed and at step 565, the code is updated. The code may be updated by re-programming the entire memory array 130 or by re-programming only desired locations in the memory array 130. Actual re-programming is controlled by write state machine circuitry (not shown) included in the interface 139 for one embodiment.

At step 570, while the BIOS update utility 151 or other start-up code still has control of the system 100, the previously locked and/or locked down blocks are re-locked by programming the appropriate bits in the lock bit array 315 as described above. Additionally, one or more blocks may have corresponding bits in the lock bit array 315 programmed to change their protection status based on the code update. Because the code update is performed while the BIOS update utility 151 or other start-up code has control of the system 151, the risk of erroneous alterations to the code or malicious destruction of code by viruses is reduced as compared to prior flash memories.

Referring back to decision block 550, if a code update has not been requested, then the blocks are re-locked or locked down at step 570 prior to turning over control of the system 100 to other software. Steps of rebooting and/or shutting down the computer system 100 may also follow.

Referring back to decision block 515, if a code update is requested and scheduled to be performed later, such as on shutdown, then at step 580 the image is protected for one embodiment, and stored for later use. At step 585, a scheduler in the BIOS update utility 151 is notified that a code update is to be performed, and at step 590, upon system 100 shutdown, the code image is loaded to the image area and unprotected. The method then continues as previously described at step 530 where the base address register is updated to store the base address of the image.

In the manner described above, updates can be made to code and/or data in locked down blocks while protecting the information stored in the locked down blocks from being otherwise altered. The blocks selected to be locked down are only unlockable while the start-up routine (or other software designated by the start-up routine) has exclusive control of the system thereby helping to prevent viruses and other destructive sources of memory corruption from altering information stored in locked down blocks. Further, the blocks can be unlocked for updates to information stored therein without requiring the system user to open up a cover on the system to change a jumper or otherwise apply a higher programming potential to the locked blocks.

For another embodiment, the protection bits corresponding to each block of the memory array are included in the memory array itself. Also, for another embodiment, the logic in the block locking circuit used in conjunction with the protection bits may be implemented in another manner while providing similar functionality. Further, while the lock bit array bits of FIG. 3 are programmed to a logical 1 to perform their above-described functions, for other embodiments, corresponding bits of the lock bit array may be programmed to a logical 0 to perform the same functions. For such embodiments, the remainder of the block locking circuit logic is changed accordingly to provide complementary logic.

It will be appreciated by those skilled in the art that, although the example above describes a flash memory used to store boot code, a BIOS or other start-up routine, other types of nonvolatile memories storing other types of information may be used for other embodiments in a similar manner.

In the foregoing specification, the invention has been described with reference to specific exemplary embodiments thereof. It will, however be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device comprising:
   a nonvolatile memory array including a first block of memory cells; and
   at least a first volatile protection bit coupled to the first block, the first volatile protection bit being selectively programmable to a first type of memory access operation directed to the first block from being performed.

2. The memory device of claim 1 wherein the first protection bit is a one-way writeable bit to lock-down the first block, and wherein the first type of memory access operation includes a memory write operation and a memory erase operation.

3. The memory device of claim 2 further including
   a second volatile protection bit coupled to the first block and to the block locking circuit,
   the second volatile protection bit being selectively programmable to lock the first block to prevent write and erase operations to the first block,
   the second volatile protection bit further being selectively programmable to unlock the first block to allow write and erase operations to the first block if the first block is not locked down.

4. The memory device of claim 3 further including
   a third volatile protection bit coupled to the first block and to the block locking circuit,
   the third volatile protection bit being selectively programmable to read lock the first block to prevent read operations to the first block,
   the third protection bit further being selectively programmable to unlock the first block to allow read operations to the first block if the first block is not locked down.

5. A memory device comprising:
   a nonvolatile memory array including a first block of memory cells;
   a first volatile protection bit coupled to the first block, the first volatile protection bit being selectively programmable to prevent a first type of memory access operation directed to the first block from being performed; and
   a reset detector coupled to the first volatile protection bit, the reset detector to clear the first volatile protection bit in response to detecting one of a reset event or a power down event.

6. A memory device comprising:
   a nonvolatile memory array including a first block of memory cells;
   a one-way writeable protection bit coupled to the first block, the one-way writeable protection bit being selectively programmable to lock-down the first block to prevent a first type of memory access operation directed to the first block from being performed;
   a second protection bit coupled to the first block, the second protection bit being selectively programmable to lock the first block to prevent write and erase operations to the first block, the second protection bit further being selectively programmable to unlock the first block to allow write and erase operations to the first block if the first block is not locked down;
   a third protection bit coupled to the first block, the third protection bit being selectively programmable to lock the first block to prevent read operations to the first block, the third protection bit further being selectively programmable to unlock the first block to allow read operations to the first block if the first block is not locked down; and
   a reset detector coupled to the first, second, and third protection bits, the reset detector to clear the first, second, and third protection bits in response to detecting one of a reset event or a power down event.

7. The memory device of claim 1 further including a no lock-down bit coupled to the first protection bit, the no lock-down bit being one way writeable between power cycles to prevent the state of the first protection bit from being changed.

8. The memory device of claim 5 further including a first pin, wherein the reset detector is further responsive to a signal on the first pin to clear the first protection bit.

9. The memory device of claim 1 wherein the memory array is a flash memory array and the first protection bit is a static random access memory (SRAM) bit.

10. A flash memory comprising:
    a nonvolatile memory array including first and second blocks;
    a volatile lock bit array coupled to the memory array, the volatile lock bit array including first protection bits corresponding to each of the first and second blocks, the first protection bits each being selectively programmable to lock the corresponding block such that the corresponding block cannot be accessed for a first type of memory operation; and
    a reset detector coupled to the volatile lock bit array, the reset detector responsive to one of a reset event or a power down event to clear the first protection bits.

11. The flash memory of claim 10 wherein each of the first protection bits is one-way writeable to lock down the corresponding block and wherein the first type of memory access operation includes memory write and erase operations.

12. The flash memory of claim 11 wherein the volatile lock bit array further includes
    second protection bits corresponding to each of the first and second blocks,
    the second protection bits each being programmable to lock the corresponding block to prevent write and erase operations to the corresponding block,
    the second protection bits each further being programmable to enable write and erase operations to the corresponding block if the corresponding block is not locked down.

13. The flash memory of claim 12 wherein the lock bit array further includes
    third protection bits corresponding to each of the first and second blocks,
    the third protection bits each being programmable to lock the corresponding block to prevent read operations to the corresponding block,
    the third protection bits each further being programmable to enable read operations to the corresponding block if the corresponding block is not locked down.

14. The flash memory of claim 10 further including a no lock-down bit coupled to the volatile lock bit array, the no lock down bit being one way writeable between power cycles to prevent the states of each of the first protection bits from being altered.

15. A method for protecting information stored in a nonvolatile memory array including a block of memory cells, the method comprising: preventing a first type of memory access operation directed to the block of memory cells from being performed if a first volatile protection bit associated with the block of memory cells has been selectively programmed to set the first volatile protection bit.

16. The method of claim 15 further including:
clearing the first protection bit in response to one of a reset event or a power cycle.

17. The method of claim 15 wherein the first type of memory access operation includes write and erase operations, the method further including: preventing memory read operations directed to the block of memory cells from being performed if a second volatile protection bit associated with the block of memory cells has been selectively programmed to set the second volatile protection bit.

18. The method of claim 15 further including preventing the first type of memory access operation directed to the block of memory cells from being performed even if the first volatile protection bit is cleared if a second volatile, selectively programmable protection bit corresponding to the first block has been selectively programmed to set the second volatile protection bit.

19. A cellular telephone comprising:
a bus to communicate information;
a processor coupled to the bus;
a wireless transceiver coupled to the bus; and
a memory coupled to the bus, the memory comprising:
  a block of nonvolatile memory cells; and
  a first volatile protection bit coupled to the block of nonvolatile memory cells, the first volatile protection bit being selectively programmable to prevent a first type of memory access operation directed to the block of nonvolatile memory cells from being performed.

20. The cellular telephone of claim 19 further including a reset detector coupled to the bus and a system power supply coupled to the reset detector and the bus, the reset detector to clear the first volatile protection bit in response to detecting one of a system reset event or a system power cycle.

21. The cellular telephone of claim 19 wherein the first protection bit is one way writeable to lock down the block of memory cells and the first type of memory access operation includes memory write and erase operations, the system further including
a second protection bit coupled to the block of memory cells,
the second protection bit being programmable to lock the block of memory cells to prevent write and erase operations to the block of memory cells,
the second protection bit further being programmable to unlock the block of memory cells to allow write and erase operations to the block if the block is not locked down.

22. The cellular telephone of claim 21 further including a third protection bit coupled to the block of memory cells, the third protection bit being programmable to prevent memory read operations directed to the block of memory cells from being performed.

23. The cellular telephone of claim 20 further including a first register coupled to the bus, wherein information stored in the first register is maintained during a reset event, and wherein information stored in the first register is cleared during a system power cycle.

24. A set top box comprising:
a bus to communicate information;
a processor coupled to the bus;
a signal receiver coupled to the bus to receive a signal; and
a memory coupled to the bus, the memory comprising:
  a block of nonvolatile memory cells; and
  a first volatile protection bit coupled to the block of nonvolatile memory cells, the first volatile protection bit being selectively programmable to prevent a first type of memory access operation directed to the block of nonvolatile memory cells from being performed.

25. The set top box of claim 24 further including a reset detector coupled to the bus and a system power supply coupled to the reset detector and the bus, the reset detector to clear the first volatile protection bit in response to detecting one of a system reset event or a system power cycle.

26. A method for changing information stored in a nonvolatile memory array in a computer system, the method including:
(a) disabling volatile write protection for the nonvolatile memory array in response to a system reset event;
(b) changing information stored in the first memory array while the write protection is disabled; and
(c) enabling write protection for the first memory array before completion of the reset event.

27. The method of claim 26 further including:
loading a code image in a second memory, and
loading a base address of the code image in a first register,
wherein changing information stored in the first memory array includes
  reading the base address from the base address register to locate the code image, and
  substituting the code image for the information stored in the first memory array.

28. The method of claim 26 further including:
storing an operation request in a second register,
wherein changing information stored in the first memory array includes reading the operation request from the second register to determine the manner in which changing is to be performed.

29. The method of claim 26 wherein disabling write protection includes clearing volatile lock-down bits corresponding to each block in the first memory array, and enabling write protection includes:
locking any blocks of the memory array that were locked before disabling write protection, and
locking down any blocks of the first memory array that were locked down before disabling write protection.

30. The method of claim 26 wherein causing a system reset event includes:
transferring system control to a start-up routine, and
the start-up routine maintaining control of the system until enabling write protection has been completed.

31. The memory device of claim 1 wherein the first protection bit is selectively programmable to lock the first block to prevent write and erase operations to the first block, and wherein the first protection bit further is selectively programmable to unlock the first block to allow write and erase operations to the first block if the first block is not locked down.

32. A memory device comprising:
a nonvolatile memory array including a first block of memory cells;
a reset detector;

a first volatile protection bit coupled to the reset detector and to the first block, the first volatile protection bit being selectively programmable to set the first protection bit to prevent a first type of memory access operation directed to the first block from being performed, the first volatile protection bit further being reset only in response to a reset event detected by the reset detector.

33. The memory device of claim 32 wherein the reset event detected by the reset detector is an internal reset signal.

34. The memory device of claim 32 wherein the reset event detected by the reset detector is a system voltage being below a predetermined level.

35. The memory device of claim 32 wherein the first volatile protection bit is a one-way writeable bit to lock-down the first block, and wherein the first type of memory access operation includes a memory write operation and a memory erase operation.

36. The memory device of claim 35 further including a second protection bit coupled to the first block, the second protection bit being selectively programmable to lock the first block to prevent write and erase operations to the first block, the second protection bit further being selectively programmable to unlock the first block to allow write and erase operations to the first block if the first block is not locked down.

37. The memory device of claim 36 further including a third volatile protection bit coupled to the first block, the third volatile protection bit being selectively programmable to read lock the first block to prevent read operations to the first block, the third volatile protection bit further being selectively programmable to unlock the first block to allow read operations to the first block if the first block is not locked down.

38. A memory device comprising:

a nonvolatile memory array including a first block of memory cells;

a selectively programmable write lock protection bit;

a selectively one-way writeable lock-down protection bit; and a block locking circuit coupled to the write lock protection bit and to the one-way writeable lock-down protection bit to prevent a first type of memory access operation directed to the first block from being performed if one or both of the write lock protection bit and the lock-down protection bit are set.

* * * * *

UNITED STATES PATENT AND TRADEMARK OFFICE
CERTIFICATE OF CORRECTION

PATENT NO. : 6,026,016
DATED : February 15, 2000
INVENTOR(S) : Gafken

It is certified that error appears in the above-identified patent and that said Letters Patent is hereby corrected as shown below:

In column 15, at line 7, after "programmable to" insert "prevent"

Signed and Sealed this

Eighth Day of May, 2001

Attest:

NICHOLAS P. GODICI

Attesting Officer      Acting Director of the United States Patent and Trademark Office